United States Patent
Jauernig et al.

(10) Patent No.: US 12,416,675 B2
(45) Date of Patent: Sep. 16, 2025

(54) APPARATUS AND METHOD FOR BATTERY SOH ESTIMATION, METHOD FOR FORMING A 2D-LUT THEREOF

(71) Applicant: Gotion, Inc., Fremont, CA (US)

(72) Inventors: David Jauernig, Fremont, CA (US); Trevor Jones, Fremont, CA (US); Xiaojun Li, Fremont, CA (US)

(73) Assignee: Gotion, Inc.

( * ) Notice: Subject to any disclaimer, the term of this patent is extended or adjusted under 35 U.S.C. 154(b) by 538 days.

(21) Appl. No.: 17/749,853

(22) Filed: May 20, 2022

(65) Prior Publication Data
US 2023/0375623 A1     Nov. 23, 2023

(51) Int. Cl.
*G01R 31/367* (2019.01)
*G01R 31/36* (2020.01)
*G01R 31/374* (2019.01)
*G01R 31/382* (2019.01)
*G01R 31/392* (2019.01)

(52) U.S. Cl.
CPC ....... *G01R 31/367* (2019.01); *G01R 31/3648* (2013.01); *G01R 31/374* (2019.01); *G01R 31/382* (2019.01); *G01R 31/392* (2019.01)

(58) Field of Classification Search
CPC .............. G01R 31/3648; G01R 31/367; G01R 31/374; G01R 31/382; G01R 31/392
See application file for complete search history.

(56) References Cited

U.S. PATENT DOCUMENTS

| | | | |
|---|---|---|---|
| 2011/0012604 A1* | 1/2011 | Tsujiko | H01M 4/5825 |
| | | | 324/427 |
| 2011/0060538 A1 | 3/2011 | Fahimi et al. | |
| 2014/0266060 A1* | 9/2014 | Ying | H02J 7/005 |
| | | | 320/134 |
| 2016/0202324 A1* | 7/2016 | Biletska | B60L 58/12 |
| | | | 702/63 |
| 2017/0085183 A1 | 3/2017 | Notsch | |
| 2019/0207274 A1 | 7/2019 | Ladpli et al. | |
| 2020/0366115 A1 | 11/2020 | Kim et al. | |

(Continued)

OTHER PUBLICATIONS

Qaisar, Event-Driven Approach for an Efficient Coulomb Counting Based Li-Ion Battery State of Charge Estimation, Procedia Computer Science 168 (2020) 202-209. (Year: 2020).*

(Continued)

*Primary Examiner* — Michael J Dalbo
(74) *Attorney, Agent, or Firm* — Nutter McClennen & Fish LLP

(57) ABSTRACT

An apparatus for battery state of health (SOH) estimation, including: a DV-calculation unit (200) configured for calculating charge-derivative voltage dV/dQ according to operating parameters of a battery, and filtering the charge-derivative voltage dV/dQ; a feature detection unit (300) configured for performing a peak and threshold detection based on the filtered charge-derivative voltage dV/dQ to detect feature which fulfills requirements defined by a typical SOC range and height interval of a center graphite peak, and calculating an average temperature of the battery during a time interval corresponding to the detected feature; an estimation unit (400) configured for performing a SOH-estimate through a 2D-Look-Up-Table (2D-LUT) based on the detected feature and the average temperature.

15 Claims, 8 Drawing Sheets

(56) References Cited

U.S. PATENT DOCUMENTS

| | | | | |
|---|---|---|---|---|
| 2021/0197691 A1* | 7/2021 | Stefanopoulou | ...... | H01M 10/44 |
| 2021/0325469 A1* | 10/2021 | Torai | ................. | G01R 31/3842 |
| 2021/0359347 A1* | 11/2021 | Stefanopoulou | .. | H01M 10/0525 |
| 2022/0407339 A1* | 12/2022 | Kobayashi | ........ | H02J 7/007182 |

OTHER PUBLICATIONS

International Search Report and the Written Opinion of the International Searching Authority, or the Declaration for PCT Application PCT/US23/22809, mailed Aug. 4, 2023 (7 pages).

* cited by examiner

APPARATUS AND METHOD FOR BATTERY SOH ESTIMATION, METHOD FOR FORMING A 2D-LUT THEREOF

TECHNICAL FIELD

Embodiments of the present disclosure generally relate to the field of battery, and more particularly, to an apparatus and method for battery state of health (SOH) estimation, and method for forming a 2D-LUT thereof.

BACKGROUND

This section introduces aspects that may facilitate better understanding of the present disclosure. Accordingly, the statements of this section are to be read in this light and are not to be understood as admissions about what is in the prior art or what is not in the prior art.

Secondary (rechargeable) batteries such as lithium-ion batteries are employed to provide high power and high energy densities in portable applications including, e.g., mobile devices, computing devices, and drive trains for electric vehicles.

Power and energy management of lithium-ion batteries relies upon accurate determination of battery parameters including the state of health (SOH).

The state of health of secondary batteries can be monitored by mainly three parameters: internal resistance, impedance and capacity.

This disclosure describes a SOH-estimation regarding the capacity fade due to degradation mechanisms The SOH can be defined as maximum dischargeable capacity of a fully charge battery divided by the nominal capacity.

SOH-Estimation methods can be mainly separated into three categories: direct measurements, i.e. Coulomb-Counting for a full discharge, etc.; model-based measurements, i.e. SOC-OCV relationship, DVA-based methods, etc.; adaptive battery models, i.e. NN, Kalman Filter, Observers, etc.

Regarding Coulomb-Counting, this method describes the direct measurement of the capacity by discharging a fully charged battery until the cutoff-voltage is reached at a distinguished temperature and current rate (i.e. T=25 degC, I=⅓*CN). Advantage of this method is there will be no errors due to estimation.

Regarding SOC-OCV relationship, this method estimates the SOH by bringing the SOC in connection with the open-circuit voltage (OCV). First the SOC and the OCV of a balanced battery are measured and then the cell is discharged or charged for an indefinite time. After the discharge or charge process is completed, the cell is allowed to return to a balanced state and then a second SOC and OCV measurement is taken. The relationship between the change in SOC and OCV due to the discharge or charge process can then be related to the SOH. Advantage of this method is its simple implementation.

Regarding DVA-based SOH-estimation, this method uses differential voltage analysis, i.e., $dV/dQ$ vs. Q to determine the source of capacity fade for lithium-ion batteries, or uses differential charge analysis (known as Incremental Capacity Analysis, ICA), i.e., $dQ/dV$ vs. V, to determine the capacity fade for lithium-ion batteries and to quantify the composition change in materials. For example, distance between peaks or peaks and threshold or peaks and end-of-charge may be use for estimation. Advantages of this method are high accuracy, and making direct measurement of electrode capacities possible.

SUMMARY

Inventors of this disclosure found that there are some limitations in the existing battery SOH estimation methods.

For example: the coulomb-counting method may take a lot of time; the SOC-OCV relationship method is not suitable for all cell chemistries, i.e. LFP, besides, this method is temperature dependent and needs resting time for battery; the DVA-based SOH-estimation method needs a lot of computational effort and filtering, and it is temperature dependent.

In general, embodiments of the present disclosure provide an apparatus for battery SOH estimation, a method for battery SOH estimation, and a method for forming a 2D-LUT used for battery SOH estimation. The present disclosure aims at estimating battery SOH accurately using a simple and quick method.

In a first aspect, there is provided an apparatus for battery state of health (SOH) estimation, including:
  a DV-calculation unit (200) configured for calculating charge-discrete charge-derivative voltage $dV/dQ$ according to operating parameters of a battery, and filtering the charge-discrete charge-derivative voltage $dV/dQ$;
  a feature detection unit (300) configured for performing a peak and threshold detection based on the filtered charge-discrete charge-derivative voltage $dV/dQ$ to detect feature which fulfills requirements defined by a typical SOC range and height interval of a center graphite peak, and calculating an average temperature of the battery during a time interval corresponding to the detected feature;
  an estimation unit (400) configured for performing a SOH-estimate through a 2D-Look-Up-Table (2D-LUT) based on the detected feature and the average temperature.

In a second aspect, there is provided a method for battery state of health (SOH) estimation, including:
  calculating charge-discrete charge-derivative voltage $dV/dQ$ according to operating parameters of a battery, and filtering the charge-discrete charge-derivative voltage $dV/dQ$;
  performing a peak and threshold detection based on the filtered charge-discrete charge-derivative voltage $dV/dQ$ to detect feature which fulfills requirements defined by a typical SOC range and height interval of a center graphite peak, and calculating an average temperature of the battery during a time interval corresponding to the detected feature;
  performing a SOH-estimate through a 2D-Look-Up-Table (2D-LUT) based on the detected feature and the average temperature.

In a third aspect, there is provided a method for forming a 2D-Look-Up-Table used for battery state of health estimation, including:
  extracting current, voltage, and temperature data from experimental results from battery tests that are designed to mimic the aging of the battery application;
  calculating and filtering charge-discrete charge-derivative voltage $dV/dQ$ using a low-pass filter to extract the feature which fulfills requirements defined by a typical SOC range and height interval of a center graphite peak, and calculating ground truth SOH of the tested battery using coulomb counting;

calculating a linear regression model for each temperature by bringing the feature in correlation with the ground truth SOH; and forming a 2D-LUT based on the linear regression model at various temperatures.

According to various embodiments of the present disclosure, feature is detected from the charge-discrete charge-derivative voltage dV/dQ, SOH can be estimated through the 2D-Look-Up-Table (2D-LUT) based on the feature and an average temperature. Therefore, a simple and quick method may be used to accurately estimate battery SOH.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

The present disclosure will now be discussed with reference to several example embodiments. It should be understood that these embodiments are discussed only for the purpose of enabling those skilled persons in the art to better understand and thus implement the present disclosure, rather than suggesting any limitations on the scope of the present disclosure.

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof. The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

First Aspect of Embodiments

An apparatus for battery state of health (SOH) estimation is provided in a first aspect of embodiments.

Figure 1:
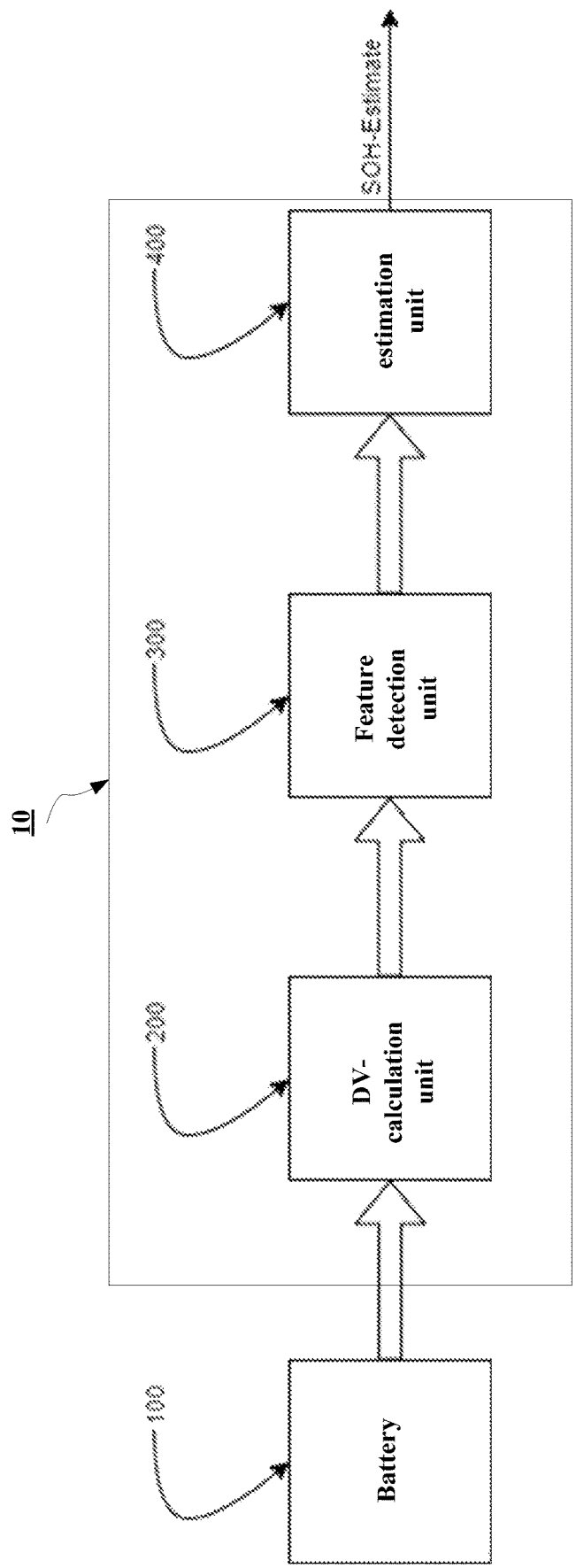
FIG. 1 is a block diagram schematically illustrating an apparatus for estimating SOH of a lithium-ion battery according to one embodiment of the present disclosure.

FIG. 1 is a block diagram schematically illustrating an apparatus 10 for estimating SOH of a battery according to one embodiment of the present invention. As shown in FIG. 1, the apparatus 10 includes a differential voltage (DV) calculation unit 200, a feature detection unit 300 and an estimation unit 400. Block 100 is a battery including one or multiple parallel-connected battery modules.

In at least one embodiment, the DV-calculation unit 200 is configured for calculating charge-discrete charge-derivative voltage dV/dQ according to operating parameters of the battery 100, and filtering the charge-discrete charge-derivative voltage dV/dQ. For example, the operating parameters may include current, voltage and temperature of the battery 100.

The feature detection unit 300 is configured for performing a peak and threshold detection based on the filtered charge-discrete charge-derivative voltage dV/dQ to detect feature which fulfills requirements defined by a typical SOC range and height interval of a center graphite peak, and calculating an average temperature of the battery 100 during a time interval corresponding to the detected feature.

The estimation unit 400 is configured for performing a SOH-estimate through a 2D-Look-Up-Table (2D-LUT) based on the detected feature and the average temperature.

According to the first aspect of disclosure, the feature is detected from the charge-discrete charge-derivative voltage dV/dQ, SOH can be estimated through the 2D-Look-Up-Table (2D-LUT) based on the feature and the average temperature. Therefore, a simple and quick method may be used to accurately estimate battery SOH.

Figure 2:
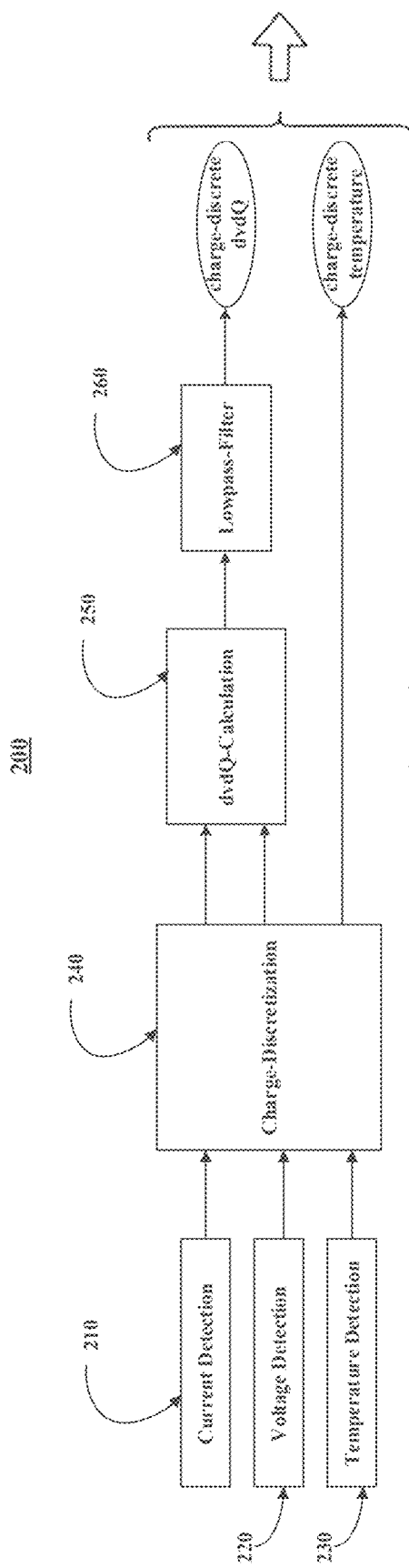
FIG. 2 is a diagram schematically illustrating the DV-calculation unit according to one embodiment of the present disclosure.

FIG. 2 is a block diagram schematically illustrating the DV-calculation unit according to one embodiment of the present disclosure. As shown in FIG. 2, the DV-calculation unit 200 includes a charge-discretization unit 240, a dV/dQ-calculation unit 250 and a low-pass filter unit 260.

The charge-discretization unit 240 may convert time-discrete signals of the operating parameters into charge-discrete signals.

The charge-discrete signal means that the measurements are taken based on Lebesgue sampling or event-based sampling. Lebesgue sampling or event-based sampling is an alternative to Riemann sampling. It means that signals are sampled only when measurements pass certain limits, more description on Lebesgue sampling or event-based sampling may be referred to the document via https://ieeexplore.ieee.org/document/1184824.

The time-discrete signals are measured at constant time interval, which is described as Riemann sampling. In contrast, the Lebesgue sampling or event-based sampling takes a measurement if the observed signal passes a defined limit. In the present disclosure, the charge-discretization unit 240 may extract and/or process signals from the time-discrete signals when the charged accumulated charge passes a defined limit, so as to generate the charge-discrete signals. The defined limit may be: $dQ_{Lebesgue}=Q(t0)-Q(t1) \geq 1$ mAh, where t1>t0.

The dV/dQ-calculation unit 250 may calculate the charge-discrete charge-derivative voltage dV/dQ based on the charge-discrete signals (for example, the charge-discrete current and the charge-discrete voltage). For example, the charge-discrete charge-derivative voltage dV/dQ may be calculated by the following equation:

$$\frac{dV}{dQ} = \frac{V(Q_2) - V(Q_1)}{Q_2 - Q_1} = \frac{V_2 - V_1}{dQ_{Lebesgue}}$$

In at least one embodiment, the charge-discrete signals used by the dV/dQ-calculation unit 250 may correspond to the signals during a low charging current I (e.g. $0<I<C_N/3$), where $C_N$ represents capacity of the battery. If charging current is getting too high, then peak detection is more difficult due to higher over voltages. The low-pass filter unit 260 may be an IIR (Infinite Impulse Response)-low-pass-filter unit. In at least one embodiment, the low-pass filter unit 260 may be implemented as a third-order cascade IIR low pass filter based on the following discretized first-order filter calculation:

$$x_{k+1} = e^{\frac{-T_s}{T}} x_k + \left(1 - e^{\frac{-T_s}{T}}\right) u_k \quad \text{(Equation 1)}$$

Where, time constant is T seconds, calculation cycle time is Ts seconds, calculation cycle is k, input signal is $u_k$, filtered signal is $x_k$, filtered signal for the next calculation cycle is $x_{k+1}$. As for the charge-discrete charge-derivative voltage dV/dQ filtering, input signal $u_k$ is dV/dQ, filtered signal $x_k$ is filtered dV/dQ.

As shown in FIG. 2, the DV-calculation unit 200 may further include a current detection unit 210 which detects the current of the battery 100, a voltage detection unit 220 which detects the voltage of the battery 100 and a temperature detection unit 230 which detects the temperature of the battery 100. In at least one embodiment, method for detecting the current, voltage and temperature of the battery 100 may be referred to the related art. However, the embodiment is not limited there to, the current detection unit 210, the voltage detection unit 220 and the temperature detection unit 230 may not be part of the DV-calculation unit 200.

Figure 3:
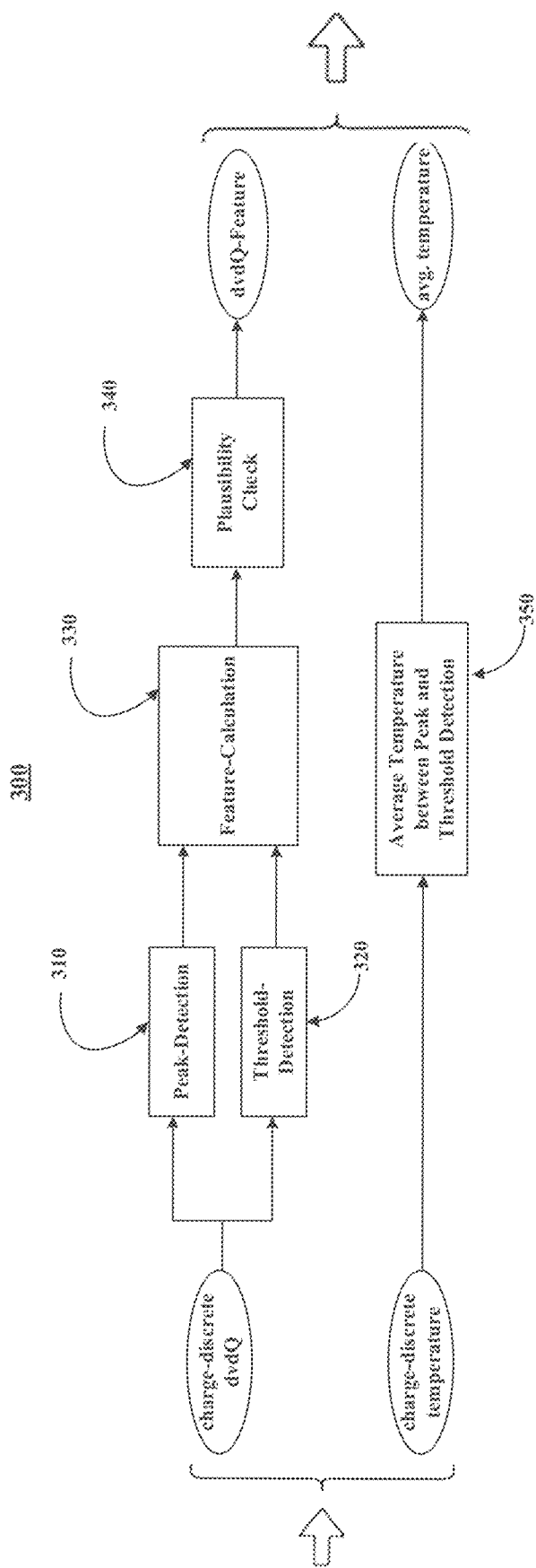
FIG. 3 is a diagram schematically illustrating the feature detection unit according to one embodiment of the present disclosure.

FIG. 3 is a block diagram schematically illustrating the feature detection unit 300 according to one embodiment of the present disclosure. As illustrated in FIG. 3, the feature detection unit 300 includes a peak detection unit 310, a threshold detection unit 320, a feature calculation unit 330, a plausibility check unit 340 and an average temperature calculation unit 350

The peak detection unit 310 may detect a first position of center graphite peak in regard of accumulated charge based on the filtered charge-discrete charge-derivative voltage dV/dQ. Where, accumulated charge may correspond to SOC of the battery. For example, the peak detection unit 310 detects the graphite-anode typical center graphite peak in the differential voltage curve, which denotes relationship between dV/dQ and accumulated charge (SOC). In at least one embodiment, the peak detection unit 310 detects the peak by performing zero-crossing detection algorithm based on the second charge-discrete charge-derivative voltage $dV^2/d^2Q$.

The threshold detection unit 320 detects a second position regarding the accumulated charge of a moment when the filtered charge-discrete charge-derivative voltage dV/dQ reaches a threshold. Value of the threshold may be greater than height of detected peak, but lower than (height of the detected peak)/{(nominal capacity)*2}, where nominal capacity refers to nominal capacity of the battery 100.

The feature calculation unit 330 calculates the distance in accumulated charge between the first position and the second position. For example, the feature calculation unit 330 may perform a subtraction of the accumulated charge of the first position and the accumulated charge of the second position to calculate the distance as a feature.

The plausibility check unit 340 may perform a plausibility check on the calculated feature based on SOC and detected current and thereby outputting the feature which fulfill the requirements defined by the typical SOC range and height interval of the center graphite peak over the lifetime and predetermined current rates.

For example, the plausibility check unit 340 which checks if the detected peak fulfils all requirements defined by the center graphite peak and if charging current was constant during the time of the peak and threshold detection. The requirements for the detected peak define a specific SOC range and height interval in which the center graphite peak is detectable over lifetime at various temperatures and current rates. The plausibility check unit 340 only output the feature which fulfill the requirements. For example, the requirements may comprise at least one of minimum peak height in V/Ah, maximum peak height in V/Ah, minimum SOC in % and maximum SOC in %. It should be noted that, if charging current is not constant, it will induce other peaks and valleys into the differential curve, which do not correlate with the electrode material composition. If the current fluctuates within a certain range, it is considered as constant current.

The average temperature calculation unit 350 calculate an average temperature measured between a moment when the center graphite peak is detected and the moment when the filtered charge-discrete charge-derivative voltage dV/dQ reaches the threshold.

Figure 4:
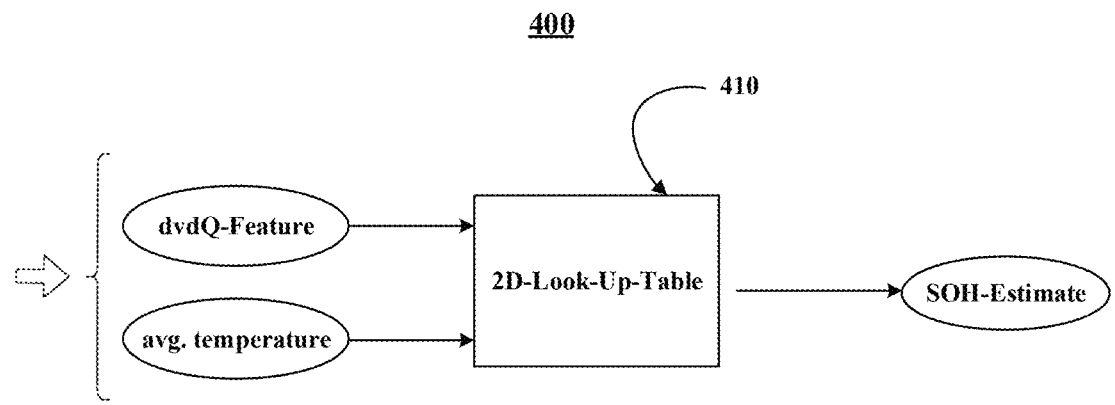
FIG. 4 is a diagram schematically illustrating the estimation unit according to one embodiment of the present disclosure.

FIG. 4 is a block diagram schematically illustrating the estimation unit 400 according to one embodiment of the present disclosure. Block 410 is 2D-Look-Up-Table (2D-LUT). The estimation unit 400 may use the detected feature and the calculated average temperature to interpolates SOH based on the 2D-Look-Up-Table of which the data is from cell experiments with various cells from the same type at various temperatures.

Figure 5:
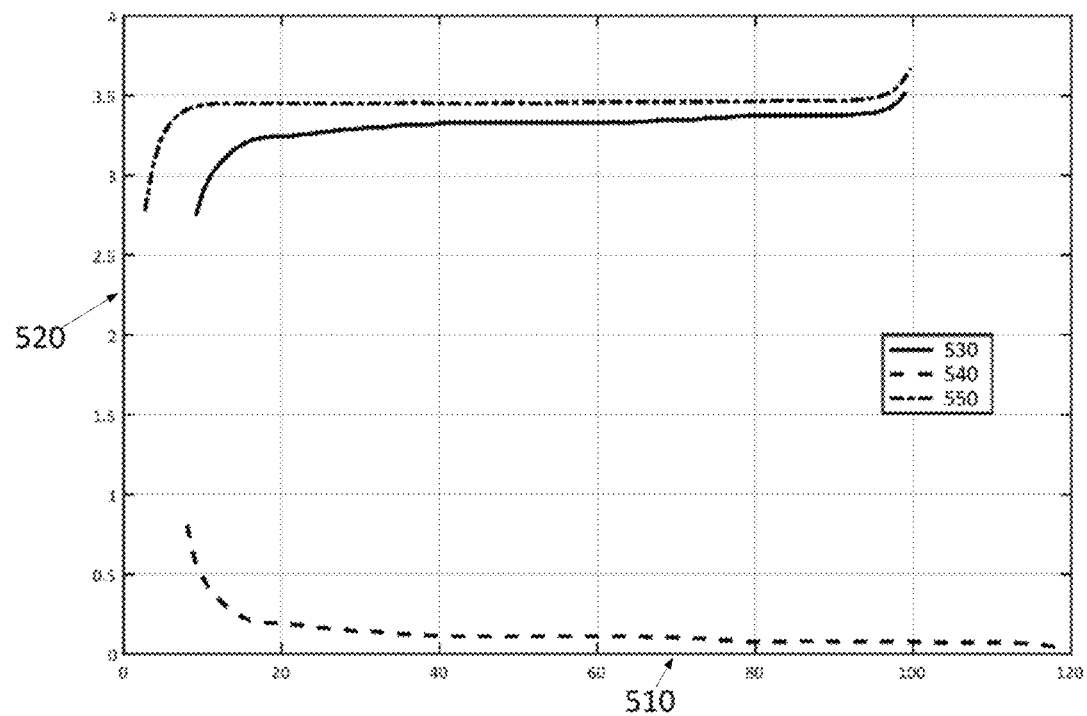
FIG. 5 is a graphical plot of data associated with charge/discharge characteristics for an exemplary battery including a full cell discharge, a cathode discharge response curve vs. lithium, and an anode charge response curve vs. lithium in accordance with one embodiment of the disclosure.

FIG. 5 is a graph illustrating the half-cell potentials of the cathode and anode as well as the cell voltage $V_{cell}$ of a typical lithium-ion battery for a charging process at low current rates (<0.5 C) over the SOC of the full cell. The cell voltage Veen can be also calculated based on equation 2.

$$V_{cell} = V_{cathode} - V_{anode} \quad \text{(Equation 2)}$$

In FIG. 5, 510 is the x-axis and describes the SOC of the measured full cell. 520 is the y-axis and describes the value of the potential of the half- and full cells. 530 is the potential of the full cell over SOC. 540 is the anode potential over SOC. 550 is the cathode potential over SOC.

Figure 6:
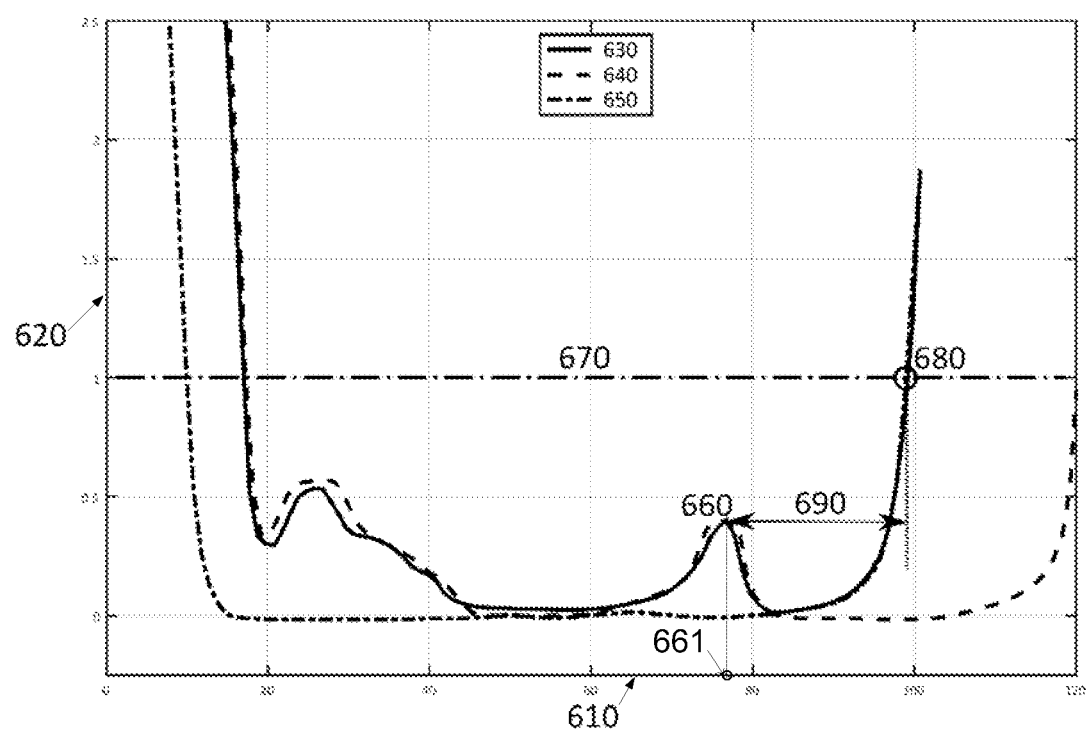
FIG. 6 is a graphical plot of anode/cathode potential derivative 640/650 and measured potential-derivative calculated from a measured discharge voltage profile of a battery in accordance with one embodiment of the disclosure.

FIG. 6 is a graph illustrating the charge-discrete charge-derivative voltage dV/dQ of the cathode and anode as well as the full cell calculated based on the superposition principle of equation 2 over the SOC of the full cell.

In FIG. 6, 610 is the x-axis and describes the SOC of the full cell. 620 is the y-axis and describes the value of the charge-discrete charge-derivative voltage dV/dQ normalized by the nominal capacity of the battery. 630 is the charge-discrete charge-derivative voltage dV/dQ of the full cell over the SOC of the full cell. 640 is the charge-discrete charge-derivative voltage dV/dQ of the anode over the SOC of the full cell. 650 is the charge-discrete charge-derivative voltage dV/dQ of the cathode over the SOC of the full cell. 660 is the for graphite-anode based lithium-ion batteries typical center graphite peak. 661 is the first position of center graphite peak in regard of SOC (corresponding to accumulated charge). 670 is the threshold. 680 is the second location when the charge-discrete charge-derivative voltage dV/dQ surpasses the threshold. 690 is the distance between the first position 661 and the second position 680 in regard of SOC. 690 may be used as the feature to estimate the SOH. For example, the estimation unit 400 (shown in FIG. 1) uses the feature 690 and the calculated average temperature (during the moment corresponding to the first position 671 and the moment corresponding to the second position 680) to interpolates SOH based on the 2D-Look-Up-Table, so as to estimate the SOH.

In FIG. 1, the 2D-Look-Up-Table used in the apparatus 10 may be preset, so that the apparatus 10 may use the 2D-Look-Up-Table directly.

Figure 7:
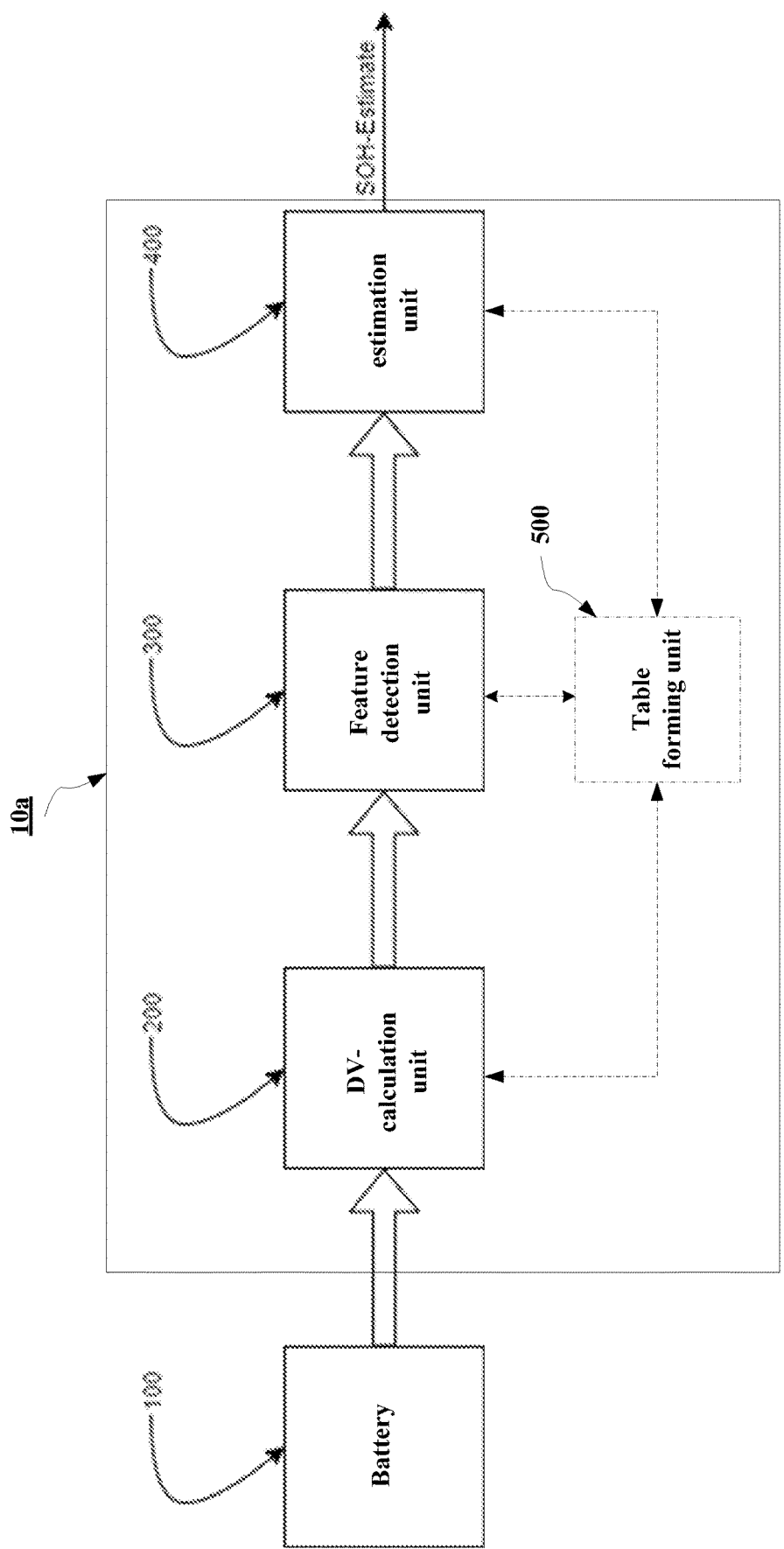
FIG. 7 is a block diagram schematically illustrating an apparatus for estimating SOH of a lithium-ion battery according to another embodiment of the present disclosure.

As shown in FIG. 7, in at least another embodiment, an apparatus 10a includes a differential voltage (DV) calculation unit 200, a feature detection unit 300 and an estimation unit 400. The apparatus may further include a table forming unit 500, which may form the 2D-Look-Up-Table used in the apparatus 10. The same parts of apparatus 10a and apparatus will not be described, the table forming unit 500 will be described below.

Figure 8:
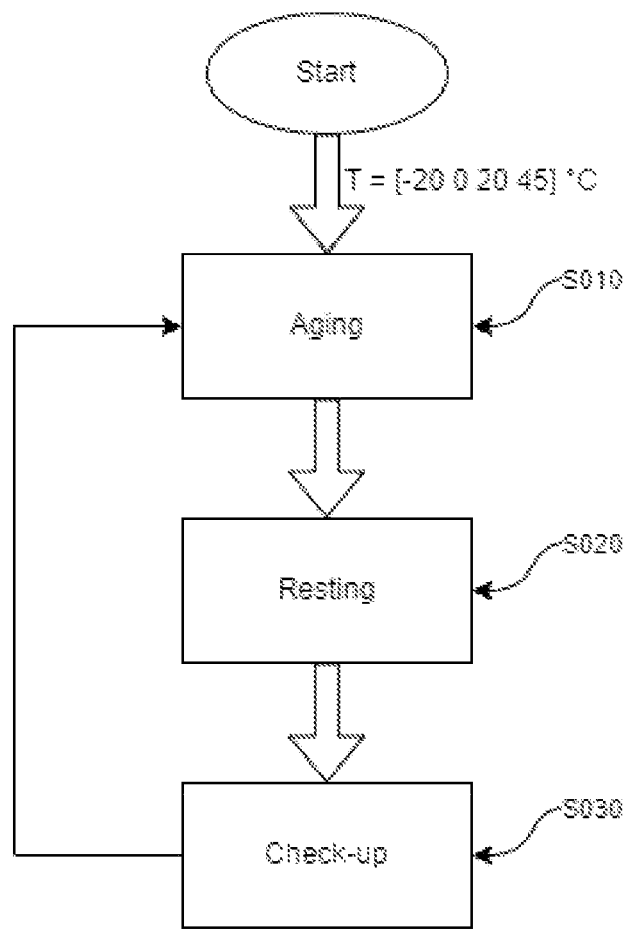
FIG. 8 is flowchart sequentially illustrating method for forming the 2D-LUT at various temperatures in accordance with one embodiment of the disclosure.

FIG. 8 is a flowchart sequentially illustrating blocks for forming the 2D-Look-Up-Table used for SOH estimation by table forming unit 500 according to one embodiment of the present disclosure.

Block S010 describes the aging process in which several batteries are cyclically aged, each at a different temperature (e.g. T=[−20 0 20 45] ° C.). Block S020 describes the resting process in which the batteries rest until they have reached their balanced state, but max. 1 hour. Block S030 describes the Check-Up process in which the batteries are cycled at least 3 times at low current rates current (0<I<$C_N$/3) to determine the ground truth capacity of batteries and the above-described feature (i.e. distance between the center graphite peak and the threshold regarding the accumulated charge, also see FIG. 6. 690) at specific age and temperature. This will be repeated until the battery has reached its SOH of <80%.

In block S020, the table forming unit 500 may perform the following operations:

Operation 1. The table forming unit 500 extracts current, voltage and temperature data from experimental results from the battery tests that are designed to mimic the aging of the battery application;

Operation 2. The table forming unit 500 calculates and filters charge-discrete charge-derivative voltage dV/dQ using a low-pass filter to extract the feature and calculating ground-truth SOH of the tested battery using coulomb counting, where the working principle of extracting the feature may refer to the description of the feature detection unit 300, for example, the table forming unit 500 may control the feature detection unit 300 to extract the feature or the table forming unit 500 may extract the feature by itself;

Operation 3. The table forming unit 500 calculates a linear regression model for each temperature by bringing the feature in correlation with the ground truth SOH; and Operation 4. The table forming unit 500 forms a 2D-LUT based on the linear regression model at various temperatures.

As can be seen from the above-mentioned embodiments, the feature is detected from the charge-discrete charge-derivative voltage dV/dQ, SOH can be estimated through the 2D-Look-Up-Table (2D-LUT) based on the feature and the average temperature. Therefore, a simple and quick method may be used to accurately estimate battery SOH.

The apparatus for battery SOH estimation in the first aspect of embodiments possess the following advantages:

- it is simple and accurate SOH-estimation (max absolute error<5%, RMSE<2.5%);
- it is based on electrochemical composition of the electrode materials;
- it can be used to distinguish between cathode aging and anode aging;
- it takes 60% less time compared to full capacity measurement @ C/3;
- it spends low computational effort due to Lebesgue sampling or event-based sampling compared to other methods;
- it can be used for Li ion cell chemistry with graphite anode (NMC, LFP, NCA, etc.);
- it can be applied at various temperatures;
- it can easily be implemented onboard for any battery application;
- it can be adjusted online;
- it can be described as white box compared to other methods like neural network (=black box);
- it does not need a full charge, a partial charge from SOC<50% to SOC>90% is sufficient.

Second Aspect of Embodiments

A method for battery state of health (SOH) estimation is provided in the second aspect of embodiments. The method is corresponding to the apparatus for battery state of health (SOH) estimation provided in the first aspect of embodiments. Same contents as those in the first aspect of embodiments are omitted.

Figure 9:
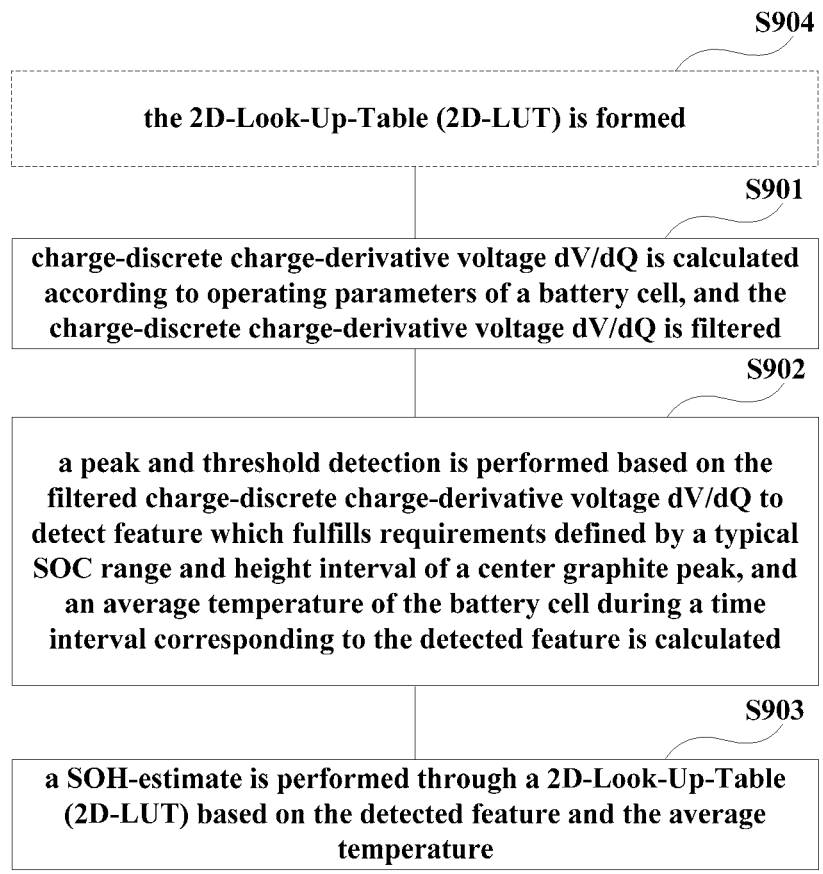
FIG. 9 is flowchart sequentially illustrating method for estimation state of health in accordance with one embodiment of the disclosure.

FIG. 9 is a flowchart of a method for battery state of health estimation according to one embodiment.

As shown in FIG. 9, the method includes:

S901. charge-discrete charge-derivative voltage dV/dQ is calculated according to operating parameters of a battery, and the charge-discrete charge-derivative voltage dV/dQ is filtered;

S902. a peak and threshold detection is performed based on the filtered charge-discrete charge-derivative voltage dV/dQ to detect feature which fulfills requirements defined by a typical SOC range and height interval of a center graphite peak, and an average temperature of the battery during a time interval corresponding to the detected feature is calculated;

S903. a SOH-estimate is performed through a 2D-Look-Up-Table (2D-LUT) based on the detected feature and the average temperature.

Details of each block may be referred to the corresponding description in the first aspect of embodiments.

As shown in FIG. 9, the method may further include:

S904. the 2D-Look-Up-Table (2D-LUT) is formed.

Details of block S904 may be referred to the flow chart of FIG. 7 in the first aspect of embodiments.

As can be seen from the above-mentioned embodiments, the feature is detected from the charge-discrete charge-derivative voltage dV/dQ, SOH can be estimated through the 2D-Look-Up-Table (2D-LUT) based on the feature and the average temperature. Therefore, a simple and quick method may be used to accurately estimate battery SOH.

Third Aspect of the Embodiments

The third aspect of the embodiments of this disclosure provides an electronic equipment including the apparatus 10, 10a or the table forming unit 500 described in the first aspect of the embodiments.

Figure 10:
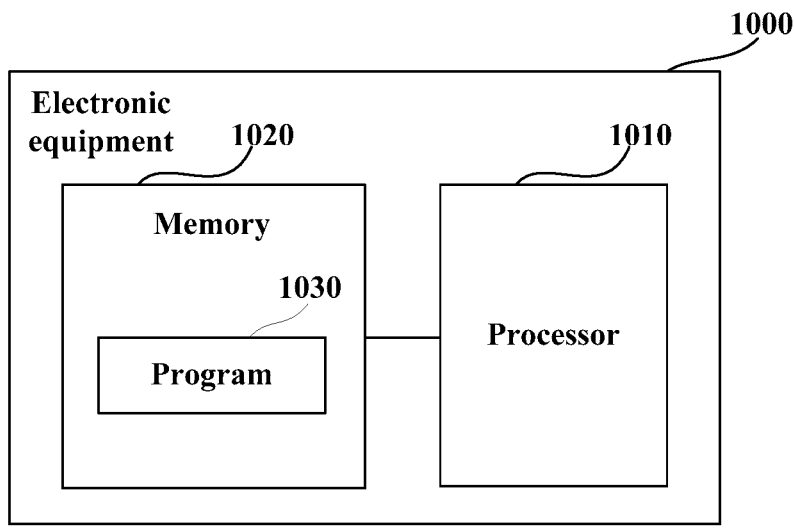
FIG. 10 is a schematic diagram of a structure of the electronic equipment of the embodiment of this disclosure.

FIG. 10 is a schematic diagram of a structure of the electronic equipment of the embodiment of this disclosure. As shown in FIG. 10, an electronic equipment 1000 may include a processor 1010 and a memory 1020, the memory 1020 being coupled to the processor 1010. The memory 1020 may store various data, and furthermore, it may store a program 1030 for data processing, and execute the program 1030 under control of the processor 1010.

In one implementation, the functions of the apparatus 10, 10a or parameter calculator 600 may be integrated into the processor 1010. The processor 1010 may be configured to be able to carry out the method in the second aspect of the embodiments.

In another implementation, the apparatus 10, 10a or the table forming unit 500 and the processor 1010 may be configured separately; for example, the apparatus 10 or the table forming unit 500 may be configured as a chip connected to the processor 1010, and the functions of the apparatus 10 or the table forming unit 500 are executed under control of the processor 1010.

Embodiments of this disclosure may further provide a computer readable program, which, when executed in an apparatus or an electronic equipment, causes the apparatus or the electronic equipment to carry out the method as described in the second aspect of the embodiments of this disclosure.

Embodiments of this disclosure may further provide a computer storage medium, including a computer readable program, which causes an apparatus or an electronic equipment to carry out the method as described in the second aspect of the embodiments of this disclosure.

The above apparatuses and methods of this disclosure may be implemented by hardware, or by hardware in combination with software. This disclosure relates to such a computer-readable program that when the program is executed by a logic device, the logic device is enabled to carry out the apparatus or components as described above, or to carry out the methods or steps as described above. This disclosure also relates to a storage medium for storing the above program, such as a hard disk, a floppy disk, a CD, a DVD, and a flash memory, etc.

The methods/apparatuses described with reference to the embodiments of this disclosure may be directly embodied as hardware, software modules executed by a processor, or a combination thereof. For example, one or more functional block diagrams and/or one or more combinations of the functional block diagrams shown in the drawings may either correspond to software modules of procedures of a computer program, or correspond to hardware modules. Such software modules may respectively correspond to the steps shown in the drawings. And the hardware module, for example, may be carried out by firming the soft modules by using a field programmable gate array (FPGA).

The soft modules may be located in an RAM, a flash memory, an ROM, an EPROM, and EEPROM, a register, a hard disc, a floppy disc, a CD-ROM, or any memory medium in other forms known in the art. A memory medium may be coupled to a processor, so that the processor may be able to read information from the memory medium, and write information into the memory medium; or the memory medium may be a component of the processor. The processor and the memory medium may be located in an ASIC. The soft modules may be stored in a memory of a mobile terminal, and may also be stored in a memory card of a pluggable mobile terminal. For example, if equipment (such as a mobile terminal) employs an MEGA-SIM card of a relatively large capacity or a flash memory device of a large capacity, the soft modules may be stored in the MEGA-SIM card or the flash memory device of a large capacity.

One or more functional blocks and/or one or more combinations of the functional blocks in the drawings may be realized as a universal processor, a digital signal processor (DSP), an application-specific integrated circuit (ASIC), a field programmable gate array (FPGA) or other programmable logic devices, discrete gate or transistor logic devices, discrete hardware component or any appropriate combinations thereof carrying out the functions described in this application. And the one or more functional block diagrams and/or one or more combinations of the functional block diagrams in the drawings may also be realized as a combination of computing equipment, such as a combination of a DSP and a microprocessor, multiple processors, one or more microprocessors in communication combination with a DSP, or any other such configuration.

This disclosure is described above with reference to particular embodiments. However, it should be understood by those skilled in the art that such a description is illustrative only, and not intended to limit the protection scope of the present invention. Various variants and modifications may be made by those skilled in the art according to the spirits and principle of the present invention, and such variants and modifications fall within the scope of the present invention.

What is claimed is:

1. An apparatus for battery state of health (SOH) estimation, comprising:
a memory; and
a processor coupled to the memory, the processor configured to:
couple a current detection unit to a battery to detect a current, couple a voltage detection unit to the battery to detect a voltage, or couple a temperature detection unit to the battery to detect a temperature;
measure operating parameters of the battery from the current detection unit, the voltage detection unit, or the temperature detection unit;
calculate charge-discrete charge-derivative voltage dV/dQ according to the operating parameters of the battery, and filtering the charge-discrete charge-derivative voltage dV/dQ;
perform a peak and threshold detection based on the filtered charge-discrete charge-derivative voltage dV/dQ to detect feature which fulfills requirements defined by a typical SOC range and height interval of a center graphite peak, and calculate an average temperature of the battery during a time interval corresponding to the detected feature; and perform an SOH-estimate through a 2D-Look-Up-Table (2D-LUT) based on the detected feature and the average temperature.

2. The apparatus for battery state of health estimation according to claim 1, wherein the operating parameters comprise current, voltage, and temperature.

3. The apparatus for battery state of health estimation according to claim 1, wherein the processor calculates charge-discrete charge-derivative voltage dV/dQ comprises the processor is configured to:

convert time-discrete signals of the operating parameters into charge-discrete signals;

calculate the charge-discrete charge-derivative voltage dV/dQ based on the charge-discrete signals; and filter the charge-discrete charge-derivative voltage dV/dQ and output the filtered charge-discrete charge-derivative voltage dV/dQ.

4. The apparatus for battery state of health estimation according to claim 1, wherein the processor performs peak and threshold detection, comprises the processor is configured to:

detect-a first position of center graphite peak in regard of accumulated charge based on the filtered charge-discrete charge-derivative voltage dV/dQ;

detect a second position regarding the accumulated charge of a moment when the filtered charge-discrete charge-derivative voltage dV/dQ reaches a threshold;

calculate a distance in accumulated charge between the first position and the second position, and output the distance as the feature;

perform a plausibility check on the calculated feature based on SOC and detected current and thereby output the feature which fulfill the requirements defined by the typical SOC range and height interval of the center graphite peak over the lifetime and predetermined current rates; and calculate an average temperature measured between a moment when the center graphite peak is detected and the moment when the filtered charge-discrete charge-derivative voltage dV/dQ reaches the threshold.

5. The apparatus for battery state of health estimation according to claim 4, wherein the processor detects a first position of center graphite peak in regard of accumulated charge based on the filtered charge-discrete charge-derivative voltage dV/dQ comprises the processor is configured to:

detect the peak by performing zero-crossing detection algorithm based on the second charge-derivative voltage $dV^2/d^2Q$.

6. The apparatus for battery state of health estimation according to claim 1, wherein the processor performs an SOH estimate comprises the processor is configured to:

use the detected feature and the calculated average temperature to interpolate SOH based on the 2D-Look-Up-Table of which the data is from cell experiments with various cells from the same type at various temperatures.

7. The apparatus for battery state of health estimation according to claim 1, wherein the processor is further configured to:

extract current, voltage, and temperature data from experimental results from battery tests that are designed to mimic the aging of the battery application;

calculate and filter charge-derivative voltage dV/dQ using a low-pass filter to extract the feature and calculate ground truth SOH of the tested battery using coulomb counting;

calculate a linear regression model for each temperature by bringing the feature in correlation with the ground truth SOH; and form a 2D-LUT based on the linear regression model at various temperatures.

8. A method for battery state of health (SOH) estimation, comprising:

coupling a current detection unit to a battery to detect a current, coupling a voltage detection unit to the battery to detect a voltage, or coupling a temperature detection unit to the battery to detect a temperature;

measuring operating parameters of a battery from the current detection unit, the voltage detection unit, or the temperature detection unit;

calculating charge-derivative voltage dV/dQ according to operating parameters of the battery, and filtering the charge-derivative voltage dV/dQ;

performing a peak and threshold detection based on the filtered charge-derivative voltage dV/dQ to detect feature which fulfills requirements defined by a typical SOC range and height interval of a center graphite peak, and calculating an average temperature of the battery during a time interval corresponding to the detected feature; and performing a SOH-estimate through a 2D-Look-Up-Table (2D-LUT) based on the detected feature and the average temperature.

9. The method for battery state of health estimation according to claim 8, wherein the operating parameters comprises current, voltage, and temperature.

10. The method for battery state of health estimation according to claim 8, wherein calculating the filtered charge-derivative voltage dV/dQ comprises:

converting time-discrete signals of the operating parameters into charge-discrete signals;

calculating the charge-derivative voltage dV/dQ based on the charge-discrete signals; and filtering the charge-derivative voltage dV/dQ and outputting the filtered charge-derivative voltage dV/dQ.

11. The method for battery state of health estimation according to claim 8, wherein detecting feature and calculating the average temperature comprises:

detecting a first position of center graphite peak in regard of accumulated charge based on the filtered charge-derivative voltage dV/dQ;

detecting a second position regarding the accumulated charge of a moment when the filtered charge-discrete charge-derivative voltage dV/dQ reaches a threshold;

calculating a distance in accumulated charge between the first position and the second position, and outputting the distance as the feature;

performing a plausibility check on the calculated feature based on SOC and detected current and thereby outputting the feature which fulfill the requirements defined by the typical SOC range and height interval of the center graphite peak over the lifetime and predetermined current rates; and calculating an average temperature measured between a moment when the center graphite peak is detected and the moment when the filtered charge-discrete charge-derivative voltage dV/dQ reaches the threshold.

12. The method for battery state of health estimation according to claim 11, wherein the method further comprises:
  detecting the peak by performing zero-crossing detection algorithm based on the second charge-derivative voltage $dV^2/d^2Q$.

13. The method for battery state of health estimation according to claim 8, wherein performing a SOH-estimate comprises:
  using the detected feature and the calculated average temperature to interpolate SOH based on the 2D-Look-Up-Table of which the data is from cell experiments with various cells from the same type at various temperatures.

14. The method for battery state of health estimation according to claim 8, wherein the method further comprises:
  extracting current, voltage, and temperature data from experimental results from battery tests that are designed to mimic the aging of the battery application;
  calculating and filtering charge-derivative voltage $dV/dQ$ using a low-pass filter to extract the feature and calculating ground truth SOH of the tested battery using coulomb counting;
  calculating a linear regression model for each temperature by bringing the feature in correlation with the ground truth SOH; and
  forming a 2D-LUT based on the linear regression model at various temperatures.

15. A method for forming a 2D-Look-Up-Table used for battery state of health estimation, comprising:
  coupling a current detection unit to a battery to detect a current, coupling a voltage detection unit to the battery to detect a voltage, or coupling a temperature detection unit to the battery to detect a temperature;
  measure operating parameters of a battery from the current detection unit, the voltage detection unit, or the temperature detection unit;
  extracting current, voltage, and temperature data from experimental results from battery tests that are designed to mimic the aging of the battery application;
  calculating and filtering charge-derivative voltage $dV/dQ$ using a low-pass filter to extract the feature which fulfills requirements defined by a typical SOC range and height interval of a center graphite peak, and calculating ground truth SOH of the tested battery using coulomb counting;
  calculating a linear regression model for each temperature by bringing the feature in correlation with the ground truth SOH; and
  forming a 2D-LUT based on the linear regression model at various temperatures.

\* \* \* \* \*